US010248479B2

(12) United States Patent
Suga et al.

(10) Patent No.: US 10,248,479 B2
(45) Date of Patent: Apr. 2, 2019

(54) ARITHMETIC PROCESSING DEVICE STORING DIAGNOSTIC RESULTS IN PARALLEL WITH DIAGNOSING, INFORMATION PROCESSING APPARATUS AND CONTROL METHOD OF ARITHMETIC PROCESSING DEVICE

(71) Applicant: FUJITSU LIMITED, Kawasaki-shi, Kanagawa (JP)

(72) Inventors: Makoto Suga, Edogawa (JP); Akio Tokoyoda, Fuchu (JP); Masatoshi Aihara, Hiratsuka (JP); Koji Hosoe, Yamato (JP); Koichiro Takayama, Hachioji (JP)

(73) Assignee: FUJITSU LIMITED, Kawasaki (JP)

( * ) Notice: Subject to any disclaimer, the term of this patent is extended or adjusted under 35 U.S.C. 154(b) by 246 days.

(21) Appl. No.: 15/150,474

(22) Filed: May 10, 2016

(65) Prior Publication Data

US 2016/0350196 A1    Dec. 1, 2016

(30) Foreign Application Priority Data

May 25, 2015  (JP) ................. 2015-105921

(51) Int. Cl.
*G06F 11/273* (2006.01)
*G06F 11/00* (2006.01)
(Continued)

(52) U.S. Cl.
CPC ............ *G06F 11/00* (2013.01); *G06F 11/273* (2013.01); *G11C 29/1201* (2013.01);
(Continued)

(58) Field of Classification Search
CPC .......... G06F 11/1008; G06F 2211/109; G06F 11/273; G11C 29/00; G11C 29/04;
(Continued)

(56) References Cited

U.S. PATENT DOCUMENTS

| 6,003,142 A | 12/1999 | Mori |
| 6,094,733 A * | 7/2000 | Momohara |

(Continued)

FOREIGN PATENT DOCUMENTS

| JP | 62-58354 | 3/1987 |
| JP | 10-171676 | 6/1998 |

(Continued)

OTHER PUBLICATIONS

SSD Controller by Thomas Rent published Apr. 9, 2010 http://www.storagereview.com/ssd_controller (Year: 2010).*

(Continued)

*Primary Examiner* — Joseph O Schell
(74) *Attorney, Agent, or Firm* — Fujitsu Patent Center (57) ABSTRACT

The arithmetic processing device includes a first memory control unit configured to control an access to a first memory, a second memory control unit configured to control an access to a second memory. The arithmetic processing device further includes a diagnostic control unit configured to sequentially diagnose parts within the first memory via the first memory control unit, and configured to sequentially store in the second memory via the second memory control unit, diagnostic results of sequentially diagnosing the parts in parallel with the diagnosing the parts via the first memory control unit.

9 Claims, 7 Drawing Sheets

(51) Int. Cl.
*G11C 29/12* (2006.01)
*G11C 29/26* (2006.01)
*G11C 29/36* (2006.01)
*G11C 29/44* (2006.01)
*G11C 29/46* (2006.01)
*G11C 29/56* (2006.01)

(52) U.S. Cl.
CPC .............. *G11C 29/26* (2013.01); *G11C 29/36* (2013.01); *G11C 29/44* (2013.01); *G11C 29/46* (2013.01); *G06F 2201/805* (2013.01); *G11C 29/56* (2013.01); *G11C 2029/2602* (2013.01); *G11C 2029/3602* (2013.01); *G11C 2029/4402* (2013.01); *G11C 2029/5604* (2013.01)

(58) Field of Classification Search
CPC ......... G11C 29/06; G11C 29/08; G11C 29/10; G11C 29/12; G11C 29/48; G11C 29/56; G11C 29/56012; G11C 29/5606; G11C 2029/2602; G11C 29/148; G11C 29/26; G11C 29/1201
See application file for complete search history.

(56) References Cited

U.S. PATENT DOCUMENTS

| | | |
|---|---|---|
| 6,501,690 B2* | 12/2002 | Satoh |
| 6,675,335 B1* | 1/2004 | Chiang |
| 7,200,721 B1* | 4/2007 | Lang |
| 2001/0026486 A1 | 10/2001 | Ogawa et al. |
| 2005/0138497 A1* | 6/2005 | Hassan |
| 2005/0160344 A1* | 7/2005 | Park |
| 2008/0109688 A1* | 5/2008 | Gribok |
| 2010/0138707 A1 | 6/2010 | Yanagida |
| 2011/0228620 A1* | 9/2011 | Chou |
| 2012/0023374 A1* | 1/2012 | Ohnishi |
| 2014/0340975 A1 | 11/2014 | Nakatani |
| 2016/0293272 A1* | 10/2016 | Anand |

FOREIGN PATENT DOCUMENTS

| | | |
|---|---|---|
| JP | 2001-267389 | 9/2001 |
| JP | 2003-016798 | 1/2003 |
| JP | 2010-134979 A | 6/2010 |
| WO | 2013/114615 A1 | 8/2013 |

OTHER PUBLICATIONS

Japanese Office Action dated Oct. 2, 2018 for corresponding Japanese Patent Application No. 2015-105921, with English Translation, 7 pages.

* cited by examiner

ARITHMETIC PROCESSING DEVICE STORING DIAGNOSTIC RESULTS IN PARALLEL WITH DIAGNOSING, INFORMATION PROCESSING APPARATUS AND CONTROL METHOD OF ARITHMETIC PROCESSING DEVICE

CROSS-REFERENCE TO RELATED APPLICATIONS

This application is based upon and claims the benefit of priority of the prior Japanese Patent Application No. JP2015-105921, filed on May 25, 2015, the entire contents of which are incorporated herein by reference.

FIELD

The present invention pertains to an arithmetic processing device, an information processing apparatus, and a control method of an arithmetic processing device.

BACKGROUND

In recent years, memories have been various in terms of physical shapes, structures, usage modes and other equivalent elements, and such a case is assumed that a failure is hard to be analyzed. For example, a stacked memory has an internal physical structure varied from conventional structures, and it is possible that a failure occurs depending on a physical position of a memory cell. For instance, a cooling module is packaged in the memory, in which case it is assumed that internal electric characteristics vary and a minute breakage is caused due to a physical load by pressurization. It is also possible that the memory falls into a failure due to the physical load applied on the memory having the various shapes and structures.

DOCUMENTS OF PRIOR ARTS

[Patent Document 1] Japanese Patent Application Laid-Open Publication No. 2003-16798

[Patent Document 2] Japanese Patent Application Laid-Open Publication No. H10-171676

[Patent Document 3] Japanese Unexamined Patent Application Publication No. S62-58354

SUMMARY

One aspect of the present invention is exemplified by an arithmetic processing device or a processor that follows. Namely, the arithmetic processing device includes a first memory control unit to control an access to a first memory, a second memory control unit to control an access to a second memory and a diagnostic control unit to sequentially diagnose parts within the first memory via the first memory control unit, and to sequentially store in the second memory via the second memory control unit, diagnostic results of sequentially diagnosing the parts in parallel with the diagnosing the parts via the first memory control unit.

The object and advantage of the embodiment will be realized and attained by means of the elements and combinations particularly pointed out in the appended claims.

It is to be understood that both the foregoing general description and the following detailed description are exemplary and explanatory only and are not restrictive of the invention, as claimed.

DESCRIPTION OF EMBODIMENT(S)

Figure 1:
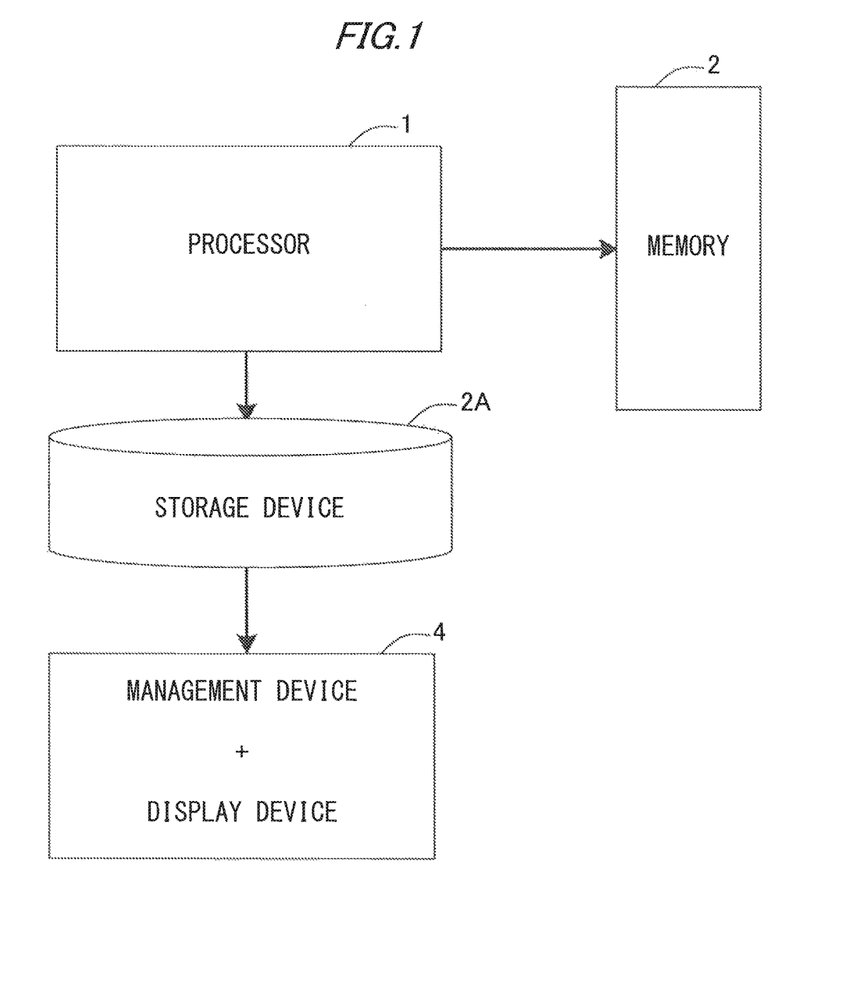
FIG. 1 is a diagram illustrating a configuration of an information processing apparatus.

An information processing apparatus according to one embodiment will hereinafter be described with reference to the drawings. FIG. 1 illustrates a configuration of the information processing apparatus. The information processing apparatus includes a processor 1, a memory 2, a storage device 2A and a management device 4. The processor 1 diagnoses the memory 2 installed in the information processing apparatus according to a predetermined diagnosis procedure. For example, The processor 1 diagnoses the memory 2 to determine whether a failure exists therein, and stores diagnosis result data indicating a state of failure in the storage device 2A. The diagnosis will hereinafter be also termed a "test". The diagnosis result will be also referred to as a "test result". The processor 1 is one example of an "arithmetic processing device".

The memory 2 is one of storage devices installed in the information processing apparatus, and is a target device to be diagnosed by the processor 1. The storage device 2A stores the diagnosis result when the processor 1 diagnoses the memory 2. The memory 2 and the storage device 2A may be memory chips different from each other. The storage device 2A may be part of the memory 2. It may be sufficient that the processor 1 includes memory controllers mutually independently accessing respective parts of the memory 2. It may also be sufficient that the processor 1 causes a first memory controller to sequentially diagnose respective parts of a first segment of the memory 2, and causes a second memory controller to store diagnostic results of the respective parts of the first segment in a second segment of the memory 2 in parallel with the diagnosis of the first segment.

The storage device 2A retains, e.g., three types of diagnostic results instanced by occurrence of a correction-enabled error, occurrence of a correction-disabled error and no occurrence of error with respect to addresses of the memory 2. It may be therefore sufficient that the storage device 2A retains, e.g., 3-bit diagnostic results with respect to the addresses of the memory 2.

Additionally, when the diagnostic result is such an error as to explicitly indicate which bit the failure occurs in, the storage device 2A may store information indicating which bit the failure occurs in. The 3-bit diagnostic results are based on the premise that a general failure like a 1-bit failure can be determined. However, a possibility of a multi-bit failure causing errors in a plurality of bits at the same timing is considered depending on a failure mode. It is therefore desirable to enable the diagnosis about whether valid values are read by a simple write/read process. It is also desirable for the diagnosis based on the simple write/read process that the storage device 2A has a capacity large enough to retain the diagnostic results corresponding to a memory cell count of the memory 2. In addition, it is also desirable that the processor 1 diagnoses a diagnosis target range of the memory 2 desirably without any interruption during the diagnosis of the diagnosis target range of the memory 2 irrespective of whether the error occurs. It is also desirable that the processor 1 can sequentially transfer the diagnostic results about the respective parts to the storage device 2A in parallel with diagnosing the respective parts in the diagnosis target range. This is because the processor 1 diagnoses the diagnosis target ranges of the memory 2 without the interruptions while uniforming diagnostic conditions, thus enabling the diagnosis of each of plural diagnosis target ranges of the memory 2.

The management device 4 acquires the diagnostic results from the storage device 2A, and analyzes an occurrence state of the error. The management device 4 may convert the addresses of the memory 2 into positions in terms of a physical structure of the memory 2 to display the occurrence state of the error in the position in the physical structure. Connections of the memory cells of the memory 2 may expand in three-dimensional directions, in which case the management device 4 desirably conducts the analysis taking account of the three-dimensional directions, e.g., triaxial directions of X, Y and Z when performing the analysis. The analysis by the management device 4 entails providing information on a physical position of the failure, based on positional information of the addresses of the memory 2 in the physical structure.

The management device 4 desirably provides information enabling a grasp of the troubling portion of the whole of the memory 2 in addition to detecting a characteristic trouble in part of the memory 2. The processor 1 and the management device 4 are therefore configured to enable the diagnosis of a quality of the post-installing memory 2 substantially in the same period of time as hitherto or in a shorter period of time than hitherto at the memory cell level. The management device 4 performs a statistical analysis from the information of the memory cell level. The management device 4 provides a user with information for specifying a cause of the occurrence of the trouble by displaying an analytic result on, e.g., a display device.

It is desirable for executing the processes described above that the processor 1 and the management device 4 diagnose a broad range of the memory 2 at the memory cell level, and acquire the diagnostic results substantially in the same period of time as hitherto or in the shorter period of time than hitherto. Such being the case, one of aspects of the information processing apparatus demonstrated by the embodiment lies in saving detailed items of data of the diagnostic results at a high speed in parallel with diagnosing the respective parts. The following are solutions exemplified therefore.

(Solution 1) The processor 1 saves the diagnostic results in a neighboring memory to configure a write path to the neighboring memory.

(Solution 2) The processor 1 saves the diagnostic results in an external auxiliary storage by using a secondary cache memory or a data cache memory for retaining values of the diagnostic results. Note that the processor 1 may also write the diagnostic results directly to the external auxiliary storage.

Embodiment 1

Figure 2:
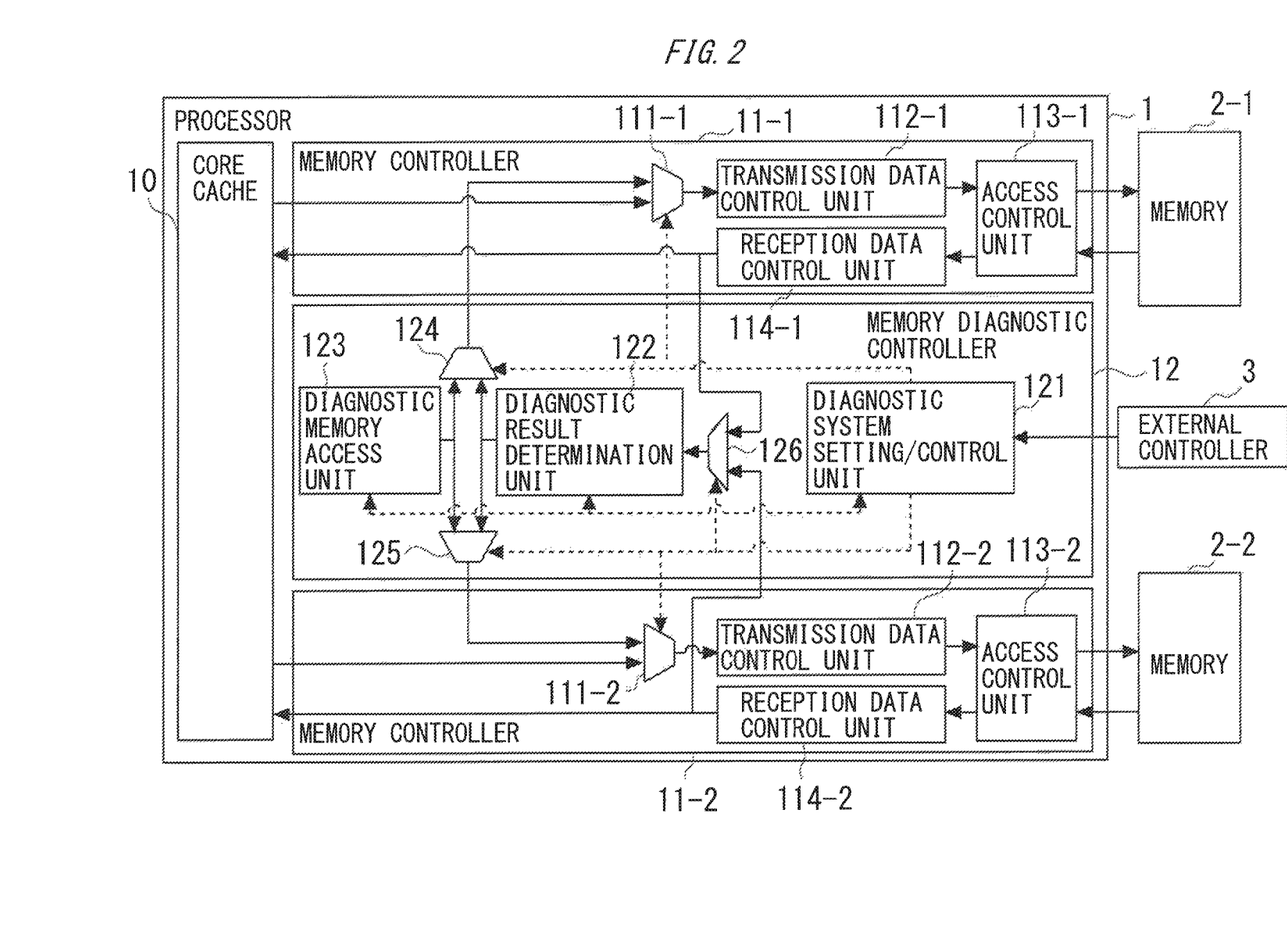
FIG. 2 is a diagram illustrating a configuration of the information processing apparatus according to Embodiment 1.

FIG. 2 illustrates a configuration of the information processing apparatus according to a first embodiment (Embodiment 1). FIG. 1 is a diagram of a concrete configuration of the information processing apparatus according to Solution 1. As in FIG. 2, the information processing apparatus includes the processor 1 and a plurality of memories 2-1, 2-2 . . . . The processor 1 in FIG. 2 is connected to an external controller 3. The external controller 3 is one example of the management device 4 in FIG. 1.

The processor 1 executes an arithmetic process by accessing the memories 2-1, 2-2 . . . . Each of the memories 2-1, 2-2 . . . is, e.g., a memory chip. FIG. 2 depicts the two memories 2-1, 2-2, and it does not, however, mean that a number of the memory chips is limited to "2" in the first embodiment. The memories 2-1, 2-2 . . . accept a data write request, a data read request and other equivalent requests from the processor 1, based on a predetermined Interface Standard. The memories 2-1, 2-2 . . . output read request target data to the processor 1. The memories 2-1, 2-2 . . . will hereinafter be called the memory 2 when generically termed.

The processor 1 includes a core cache 10, a plurality of memory controllers 11-1, 11-2, . . . , and a memory diagnostic controller 12. The core cache 10 includes a plurality of processor cores and a cache. The core cache 10 can be said to be one example of "a plurality of processor cores". The memories 2-1, 2-2 are one example of "a plurality of memories". The memory controllers 11-1, 11-2 are one example of "a plurality of memory control units". The memory diagnostic controller 12 is one example of "a diagnostic control unit". The processor core is one example of "an arithmetic core".

According to Embodiment 1, the processor 1 includes memory controllers 11-1, 11-2 corresponding to the plurality of memories 2-1, 2-2 . . . . FIG. 2 illustrates the two memory controllers 11-1, 11-2, and it does not, however, mean that a number of the memory controllers is limited to "2". The memory controllers 11-1, 11-2, . . . will hereinafter be called the memory controller 11 when generically termed.

For example, the memory controller 11-1 includes a selector 111-1, a transmission data control unit 112-1, an access control unit 113-1, and a reception data control unit 114-1. The selector 111-1 receives a selection signal from the memory diagnostic controller 12, and selects one of a request given to the memory 2-1 from the core cache 10 and a request given to the memory 2-1 from the memory diagnostic controller 12. The selector 111 (111-1, 111-2) is one example of "a third selector".

The transmission data control unit 112-1 has, e.g., a buffer, and accepts the request given to the memory 2-1 from the core cache 10 or the request given to the memory 2-1 from the memory diagnostic controller 12 via the selector 111-1. In response to the accepted request, the transmission data control unit 112-1 accesses the memory 2-1 via the access control unit 113-1, and executes writing or reading the data.

The access control unit 113-1 is an interface circuit based on Standards of, e.g., the memory 2-1. The access control unit 113-1 inputs, e.g., a clock signal, an address signal, a write data signal, a strobe signal and other equivalent signals to the memory 2-1.

The reception data control unit 114-1 has, e.g., the buffer, and acquires the read data from the memory 2-1 via the access control unit 113-1. The reception data control unit 114-1 supplies the read data from the memory 2-1 divergently to the core cache 10 and the memory diagnostic controller 12. Note that a configuration and an operation of the memory controller 11-2 are the same as those of the memory controller 11-1, and hence their explanations are omitted. It is also noted that a numeral of each component of the memory controller 11-2 is marked with a hyphen together with a branch number "2".

The memory diagnostic controller 12 includes a diagnostic system setting/control unit 121, a diagnostic result determination unit 122, a diagnostic memory access unit 123, and selectors 124, 125, 126. The diagnostic system setting/control unit 121 is one example of "a setting unit". The diagnostic result determination unit 122 is one example of "a determination unit". The diagnostic memory access unit 123 is one example of "an access unit". The selector 126 is one example of "a first selector". The selectors 124, 125 are one example of "a couple of second selectors". For example, when the memory 2-1 is set as a first diagnosis target memory, the selector 124 selects the access signal to the first memory from the access signal to the first diagnosis target memory 2-1 and the access signal to the second memory 2-2 to store the diagnostic result. The selected access signal is transmitted to the first memory. For example, when the memory 2-2 is set as the second memory to store the diagnostic result, the selector 125 selects the access signal to the second memory 2-2 to store the diagnostic result, and transmits the selected access signal to the second memory.

The diagnostic system setting/control unit 121, upon receiving a command from the external controller 3, sets selection signals of the selectors 111, 124, 125, 126 and other equivalent selectors, and starts up a diagnosis process for diagnosing the memories 2-1, 2-2 and other equivalent memories.

Exemplified is a case of diagnosing, e.g., the memory 2-2 and storing the diagnostic result in the memory 2-1. The diagnostic system setting/control unit 121 outputs the selection signals to the selectors 111-1, 111-2 to select the signals from the memory diagnostic controller 12, while blocking the accesses given from the core cache 10. The diagnostic system setting/control unit 121 outputs the selection signal to the selector 125 to select a signal from the diagnostic memory access unit 123, while blocking a signal from the diagnostic result determination unit 122. The diagnostic system setting/control unit 121 further outputs the selection signal to the selector 124 to select a signal from the diagnostic result determination unit 122, while blocking a signal from the diagnostic memory access unit 123. The diagnostic system setting/control unit 121 still further outputs the selection signal to the selector 126 to select a signal from the memory controller 11-2, while blocking a signal from the memory controller 11-1. The diagnostic system setting/control unit 121 subsequently starts up the diagnosis process.

Thereupon, the diagnostic memory access unit 123 transmits the memory access signal for the diagnosis to the transmission data control unit 112-2 of the memory controller 11-2 via the selector 125. The transmission data control unit 112-2 executes writing or reading the diagnosis data to or from the memory 2-2 via the access control unit 113-2. The reception data control unit 114-2 acquires the data that is read in response to the read request, and transmits the acquired data to the diagnostic result determination unit 122 via the selector 126.

The diagnostic result determination unit 122 compares the data read from the memory 2-2 with expected value data, thereby generating the diagnostic result. The diagnostic result determination unit 122 transmits a request for writing the diagnostic result to the memory 2-1 to the transmission data control unit 112-1 of the memory controller 11-1 via the selectors 124, 111-1. The transmission data control unit 112-1 writes the diagnostic result to the memory 2-1 via the access control unit 113-1 in response to the request accepted from the diagnostic result determination unit 122. The same procedure is applied to a case of diagnosing the memory 2-1 and storing the diagnostic result in the memory 2-2.

Thus, the memory diagnostic controller 12 diagnoses any one of the memories 2-1, 2-2, and stores the diagnostic result in the other memory. The diagnosis and the storage of the diagnostic result are conducted in parallel via the selectors 124, 125 and the memory controllers 11-1, 11-2. Accordingly, the memory diagnostic controller 12 can continue diagnosing the memories 2-1, 2-2 without interrupting the diagnosis in progress even when the diagnostic results of the memories 2-1, 2-2 contain the errors. In other words, the memory diagnostic controller 12 can diagnose the respective parts of any one of the memories 2-1, 2-2 at a predetermined access speed based on a predetermined procedure, e.g., a predetermined clock, and can save the diagnostic result in the other of the memories 2-1, 2-2 in parallel with the diagnosis. To be specific, the memory diagnostic controller 12 sequentially diagnoses the parts of the first memory 2-1 through the memory controller 11-1 serving as a diagnostic control unit that is one example of "a first memory control unit". The memory diagnostic controller 12 implements the diagnosis and concurrently stores the diagnostic result of the diagnosed parts in the second memory 2-2 in parallel with the diagnosis through the memory controller 11-2 that is one example of "a second memory control unit".

Figure 3:
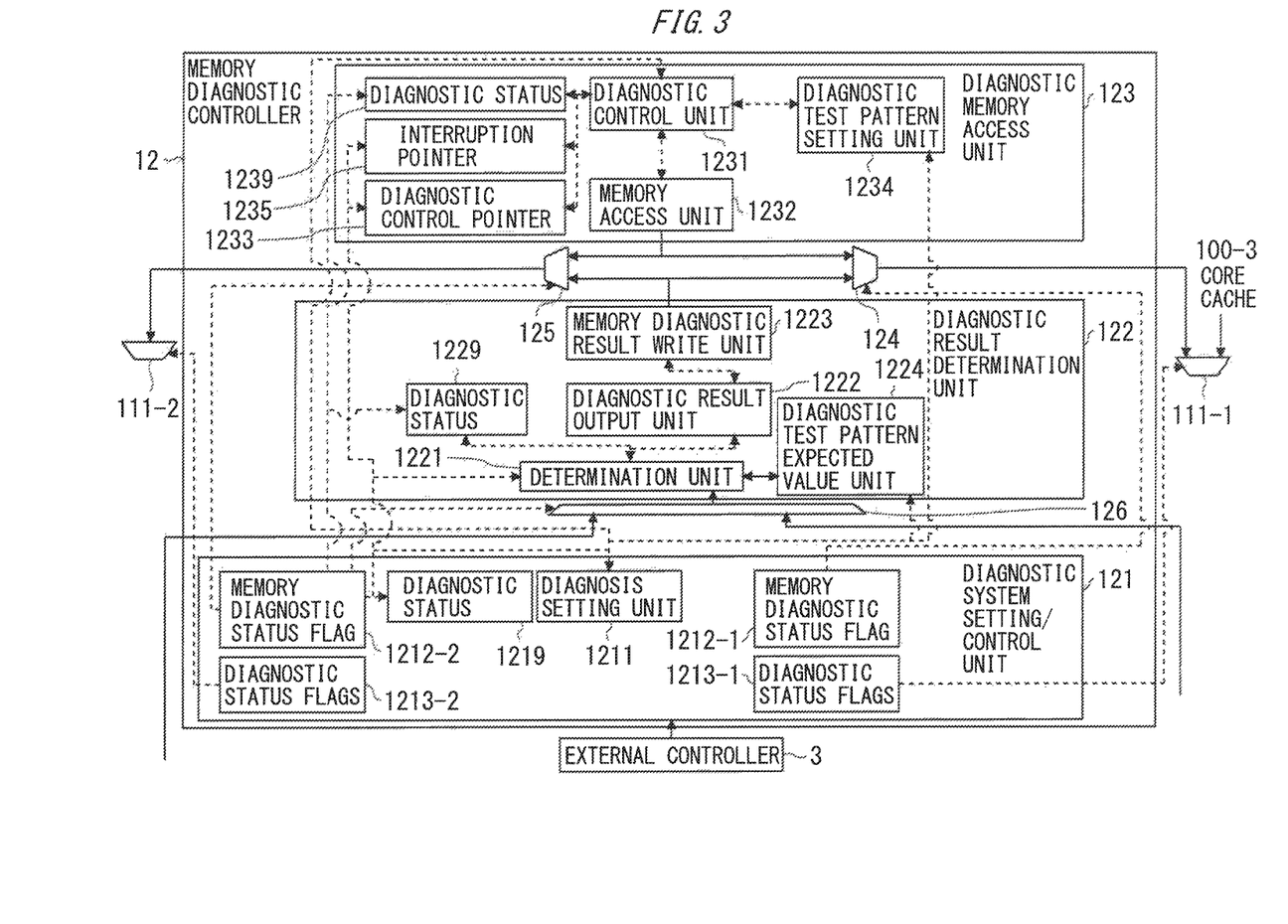
FIG. 3 is a diagram illustrating detailed configurations of a diagnostic system setting/control unit, a diagnostic result determination unit and a diagnostic memory access unit.

FIG. 3 illustrates detailed configurations of the diagnostic system setting/control unit 121, the diagnostic result determination unit 122 and the diagnostic memory access unit 123. Respective components in FIG. 3 are attained by hardware circuits including digital circuits to execute the control based on the predetermined procedure. However, the diagnostic system setting/control unit 121 may also be, e.g., a control processor to execute a computer program on the memory. This is because the diagnostic system setting/control unit 121 executes setting for diagnosing the memory 2 and a control process when finished, but is not the component for directly accessing the memories 2-1, 2-2.

The diagnostic system setting/control unit 121 includes a diagnosis setting unit 1211, memory diagnostic status flags 1212-1, 1212-2, diagnostic status flags 1213-1, 1213-2, and a diagnostic status 1219.

The diagnostic result determination unit 122 includes a determination unit 1221, a diagnostic result output unit 1222, a memory diagnostic result write unit 1223, a diagnostic test pattern expected value unit 1224, and a diagnostic status 1229.

The diagnostic memory access unit 123 includes a diagnostic control unit 1231, a memory access unit 1232, a diagnostic control pointer 1233, a diagnostic test pattern setting unit 1234, an interruption pointer 1235, and a diagnostic status 1239. The interruption pointer 1235 is one example of "an interruption indicating unit".

Among these components, the diagnosis setting unit 1211 of the diagnostic system setting/control unit 121 accepts a diagnostic designation from the external controller 3, performs a variety of settings, and starts up the diagnostic process. More specifically, the diagnosis setting unit 1211 sets the selectors 111-1, 111-2, 124, 125, 126 . . . for the diagnostic process.

To be specific, the diagnosis setting unit 1211 sets selection information of the selector 124 in the memory diagnostic status flag 1212-1. The selector 124 selects, based on a setting value of the memory diagnostic status flag 1212-1, an output signal of any one of the memory diagnostic result write unit 1223 and the memory access unit 1232 of the diagnostic memory access unit 123.

The diagnosis setting unit 1211 sets the selection information of the selectors 125, 126 in the memory diagnostic status flag 1212-2. The selector 125 selects, based on a setting value of the memory diagnostic status flag 1212-2, an output signal of any one of the memory diagnostic result write unit 1223 of the diagnostic result determination unit 122 and the memory access unit 1232 of the diagnostic memory access unit 123. The selector 126 selects, based on a setting value of the diagnostic status flag 1213-2, an output signal of any one of the memory controllers 11-1, 11-2 illustrated in FIG. 2. Note that the selectors 124, 125 may be configured to select the signals by referring to the same flag, e.g., the memory diagnostic status flag 1212-1. In this case, the signal selection of the selector 126 is controlled based on the value of diagnostic status flag 1213-2.

The diagnosis setting unit 1211 sets the selection information of the selectors 111-1, 111-2 in the diagnostic status flags 1213-1, 1213-2, respectively. The selectors 111-1, 111-2 selects an output signal any one of the memory diagnostic controller 12 and the core cache 10, based on the setting values of the diagnostic status flags 1213-1, 1213-2. In other words, when performing the diagnosis, the diagnosis setting unit 1211 blocks the access to the memory 2-1 from the core cache 10 through the diagnostic status flags 1213-1, 1213-2 and the selectors 111-1, 111-2. The selectors 111-1, 111-2 each serving as "a third selector" select the access signals to the memories 2-1, 2-2 from the processor core of the processor 1 and the access signals to the memories 2-1, 2-2 from the memory diagnostic controller 12.

The diagnosis setting unit 1211 of the diagnostic system setting/control unit 121 sets an initial value of the diagnostic control pointer 1233 of the diagnostic memory access unit 123, and a diagnostic test pattern of the diagnostic test pattern setting unit 1234. The diagnosis setting unit 1211 sets the same diagnostic test pattern as the test pattern of the diagnostic test pattern setting unit 1234 in the diagnostic test pattern expected value unit 1224 of the diagnostic result determination unit 122. Note that diagnosis setting unit 1211 sets a repetition unit pattern in the diagnostic test pattern setting unit 1234, and may also set a so-called developed pattern, into which the repetition unit pattern is iterated, in the diagnostic test pattern expected value unit 1224. The diagnostic test pattern setting unit 1234 and the diagnostic test pattern expected value unit 1224 may be configured as the same storage unit.

The diagnosis setting unit 1211 of the diagnostic system setting/control unit 121 sets the interruption pointer 1235. The interruption pointer 1235 is referred to when a storage capacity of the memory (e.g., 2-2) for storing the diagnostic result is smaller than a storage capacity of the diagnostic target memory (e.g., 2-1). The interruption pointer 1235 retains a value as a criterion for determining resumption of the diagnostic process after interrupting the diagnosis to allow the external controller 3 to acquire the diagnostic result. After the preparation described above, the diagnosis setting unit 1211 instructs the diagnostic control unit 1231 to start the diagnosis. The diagnosis setting unit 1211 also instructs the diagnostic status 1239 to finish the diagnosis.

The diagnostic test pattern setting unit 1234 of the diagnostic memory access unit 123 stores the diagnostic test pattern or a repetition unit of the diagnostic test pattern. The diagnostic control pointer 1233 retains a value as a reference for generating the diagnostic target addresses of the diagnostic target memories 2-1, 2-2. The diagnostic control pointer 1233 further retains a value for specifying a position of the diagnostic test pattern within the diagnostic test pattern setting unit 1234. Note that FIG. 3 illustrates one diagnostic control pointer 1233 retaining the value serving both as the reference value for generating the diagnostic target addresses and as the value for specifying the position of the diagnostic test pattern. However, the diagnostic control pointer 1233 may have two entries for retaining the reference value for generating the diagnostic target addresses and the value for specifying the position of the diagnostic test pattern.

The interruption pointer 1235 of the diagnostic memory access unit 123 retains the diagnostic target address with the diagnosis to be interrupted. For example, when the storage capacity of the memory (2-2) storing the diagnostic result is smaller than the capacity of the diagnostic target memory (2-1), the address of the memory (2-2) reaching a limit of the storage capacity is set in the interruption pointer 1235. The diagnostic memory access unit 123 temporarily interrupts the diagnosis when the diagnostic range of the diagnostic target memory (2-1) reaches the value of the interruption pointer.

The diagnostic control unit 1231, as the diagnosis progresses, counts up the diagnostic control pointer 1233, and generates the diagnostic target addresses of the diagnostic target memories 2-1, 2-2. In the test for reading from, e.g., the memories 2-1, 2-2, the diagnostic control unit 1231 causes the memory access unit 1232 to generate the read request according to the diagnostic control pointer 1233. The read request is one example of "an access signal making a request for reading". Note that in the write test, the diagnostic control unit 1231 causes the memory access unit 1232 to generate the write request according to the diagnostic control pointer 1233. The memory access unit 1232 sends the read request to the memory controller 11-1 or 11-2 via the selector 124 or 125.

Each of the selectors 124, 125 serving as "a couple of second selectors" selects any one of the access signal for diagnosing the first memory 2-1 and the access signal to the second memory 2-1 that stores the diagnostic result of the determination unit 1221. The selectors 124, 125 connect the respectively selected access signals to the first and second memory control units 11-1, 11-2.

In the write test, the diagnostic control unit 1231 acquires the diagnostic test pattern in the diagnostic test pattern setting unit 1234 in accordance with the diagnostic control pointer 1233. The diagnostic control unit 1231 subsequently causes the memory access unit 1232 to generate the write request in accordance with the diagnostic control pointer 1233. The memory access unit 1232 sends the write request for writing the diagnostic pattern to the memory 2-1 (or 2-2) to the memory controller 11-1 (or 11-2) via the selector 124 (or 125). The diagnostic control unit 1231 counts up the diagnostic control pointer 1233, and continues the diagnosis till a count value of the diagnostic control pointer 1233 reaches a predetermined target value. The diagnostic control unit 1231 finishes the diagnosis when the diagnostic system setting/control unit 121 notifies the diagnostic status 1239 that the diagnosis has been completed.

The diagnostic test pattern expected value unit 1224 of the diagnostic result determination unit 122 stores an expected value for the read test. When the diagnostic target memory is the memory 2-1, the determination unit 1221 acquires the read data from the diagnostic target memory 2-1 and a diagnostic target address, i.e., a read address of the read data via the selector 126. The diagnostic test pattern expected value unit 1224 checks the read data acquired from the memory 2-1 against the expected value of the diagnostic test pattern expected value unit 1224, and outputs a check result to the diagnostic result output unit 1222. The determination unit 1221 retains the diagnostic target address, i.e., the read address of the read data together with the read data from the diagnostic target memory 2-1 or 2-2, and outputs these items of data to the diagnostic result output unit 1222.

The diagnostic result output unit 1222 stores the diagnostic result in the memory 2-2 through the memory diagnostic result write unit 1223. A storage location address is an address that is uniquely specified from the diagnostic target address. The determination unit 1221 generates the storage location address, associated with the diagnostic target address, of the memory 2-2. The storage location address, of the memory 2-2 is an address to which, e.g., the diagnostic target address of the memory 2-1 is shifted by predetermined bytes. The memory diagnostic result write unit 1223 updates, as the diagnosis progresses, the storage location address, and requests the memory controller 11-2 to write the diagnostic result to the memory 2-2 via the selector 25.

Figure 4:
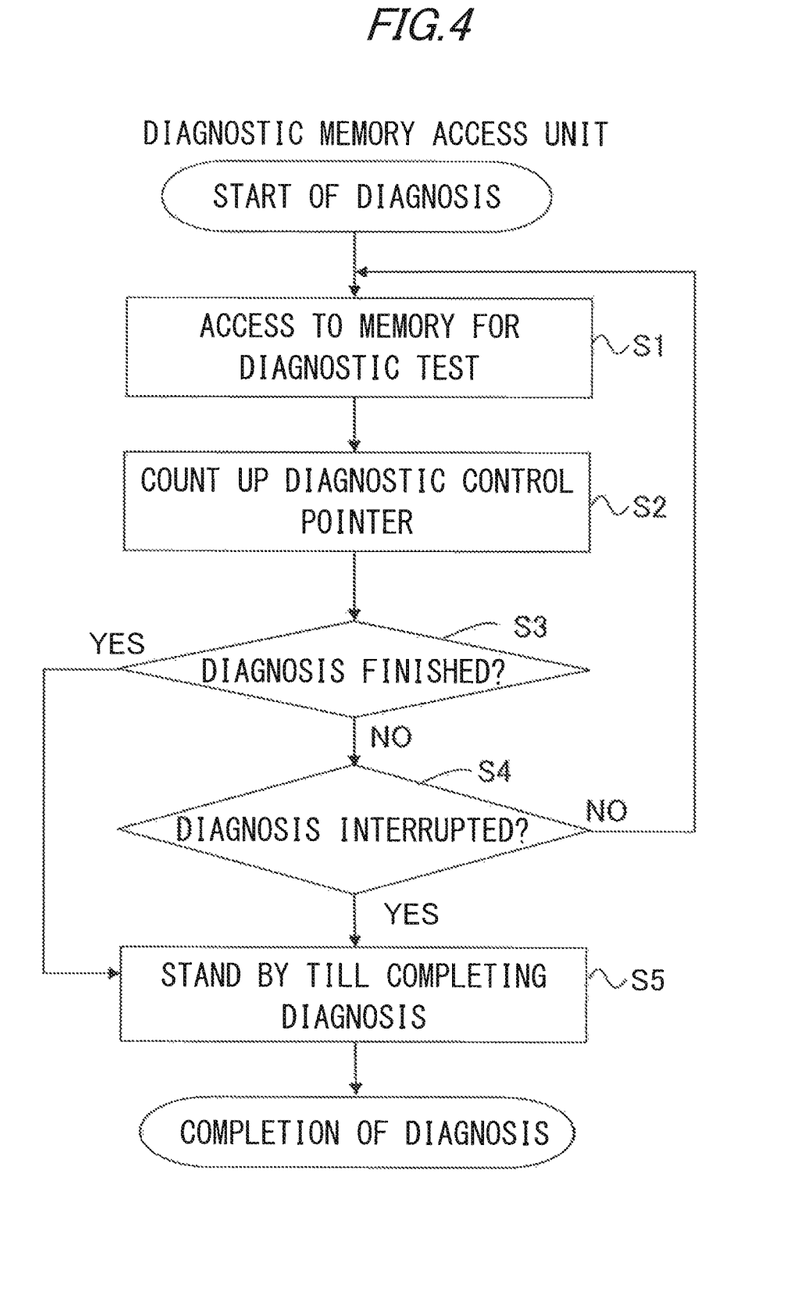
FIG. 4 is a flowchart illustrating a control sequence of the diagnostic memory access unit.

FIG. 4 illustrates a control sequence of the diagnostic memory access unit 123. The diagnostic memory access unit 123 counts up the diagnostic control pointer 1233 (S2) whenever accessing the memory for the diagnostic test (S1). The diagnostic memory access unit 123 examines the diagnostic control pointer 1233, and thus checks whether the diagnosis is finished (S3). A process of checking whether the diagnosis is finished in S3 is a check of whether a set of memory accesses for the diagnosis are terminated. When determined "NO" in S3, the diagnostic memory access unit 123 advances the control to a next step for performing the next memory access.

However, before advancing the control to a next step, the diagnostic memory access unit 123 determines whether the diagnosis is interrupted before the next memory access (S4). The interruption of the diagnosis is exemplified by such an instance that the storage capacity of the memory 2-2 for storing the diagnostic result is smaller than the capacity of the diagnostic target memory 2-1. When the storage capacity of the memory 2-2 for storing the diagnostic result is smaller than the capacity of the diagnostic target memory 2-1, the diagnostic memory access unit 123 temporarily interrupts the diagnosis after performing the memory access to the diagnostic target memory 2-1, this access corresponding to a limit of the storage capacity of the memory 2-2 for storing the diagnostic result. To be specific, when the diagnostic control pointer 1233 reaches a value, corresponding to the limit, inducing the interruption of the diagnosis, of the storage capacity of the memory 2-2 for storing the diagnostic result, of the interruption pointer 1235 (YES in S4), the diagnostic memory access unit 123 advances the control to S5. The interruption pointer 1235 serving as "an interruption indicating unit" retains a value corresponding to the smaller storage capacity of the second memory 2-2 when the diagnostic result of the diagnostic result determination unit 122 is stored in the second memory 2-2 having the storage capacity smaller than the capacity of the first memory 2-1 as the diagnostic target memory. The interruption pointer 1235 causes the diagnostic memory access unit 123 to interrupt the diagnosis of the first memory 2-1. Whereas when the diagnostic control pointer 1233 does not reach the value, corresponding to the limit, inducing the interruption of the diagnosis, of the storage capacity of the memory 2-2 for storing the diagnostic result (NO in S4), the diagnostic memory access unit 123 loops back the control to S1, and executes the next memory access.

The diagnostic memory access unit 123 stands by till the diagnosis is completed when determining in S3 that the memory access is finished till terminating the diagnosis or when determining in S4 that the diagnosis is interrupted (S5). More specifically, the determination unit 1221, when receiving responses to all of the memory accesses issued by the diagnostic memory access unit 123, reports the completion of diagnosis to the diagnostic status 1219 of the diagnostic system setting/control unit 121 via the diagnostic status 1229. Upon receiving the notification of the completion of diagnosis, the diagnostic system setting/control unit 121 sets the completion of diagnosis in the diagnostic status 1239 indicating the diagnostic status. When notified of the completion of diagnosis, the diagnostic memory access unit 123 stops operating.

In the manner described above, the diagnostic memory access unit 123 issues the memory accesses to all of the segments of the diagnostic target memory 2-1, or alternatively issues the memory accesses up to the limit, inducting the interruption of the diagnosis, of the storage capacity of the memory 2-2 for storing the diagnostic result due to the interruption of the diagnosis. When the external controller 3 reads the diagnostic result from the memory 2-2 for storing the diagnostic result, the diagnostic system setting/control unit 121 starts up the next diagnostic process. The external controller 3 controls the processing to write the information of the memory 2-2 to an external storage area, and the diagnostic system setting/control unit 121 starts up the next diagnostic process after the diagnostic result has been read. The external storage area connotes an external storage device to be connected via, e.g., an I/O interface.

Next, when the diagnostic system setting/control unit 121 starts up the next diagnostic process in combination with the diagnostic memory access unit 123, the diagnostic memory access unit 123 accesses a new diagnostic target memory or the diagnostic target memory with its diagnosis being interrupted. Note that the diagnostic system setting/control unit 121, it may be sufficient, simply designates a next access destination by setting the initial value of the diagnostic control pointer 1233.

Figure 5:
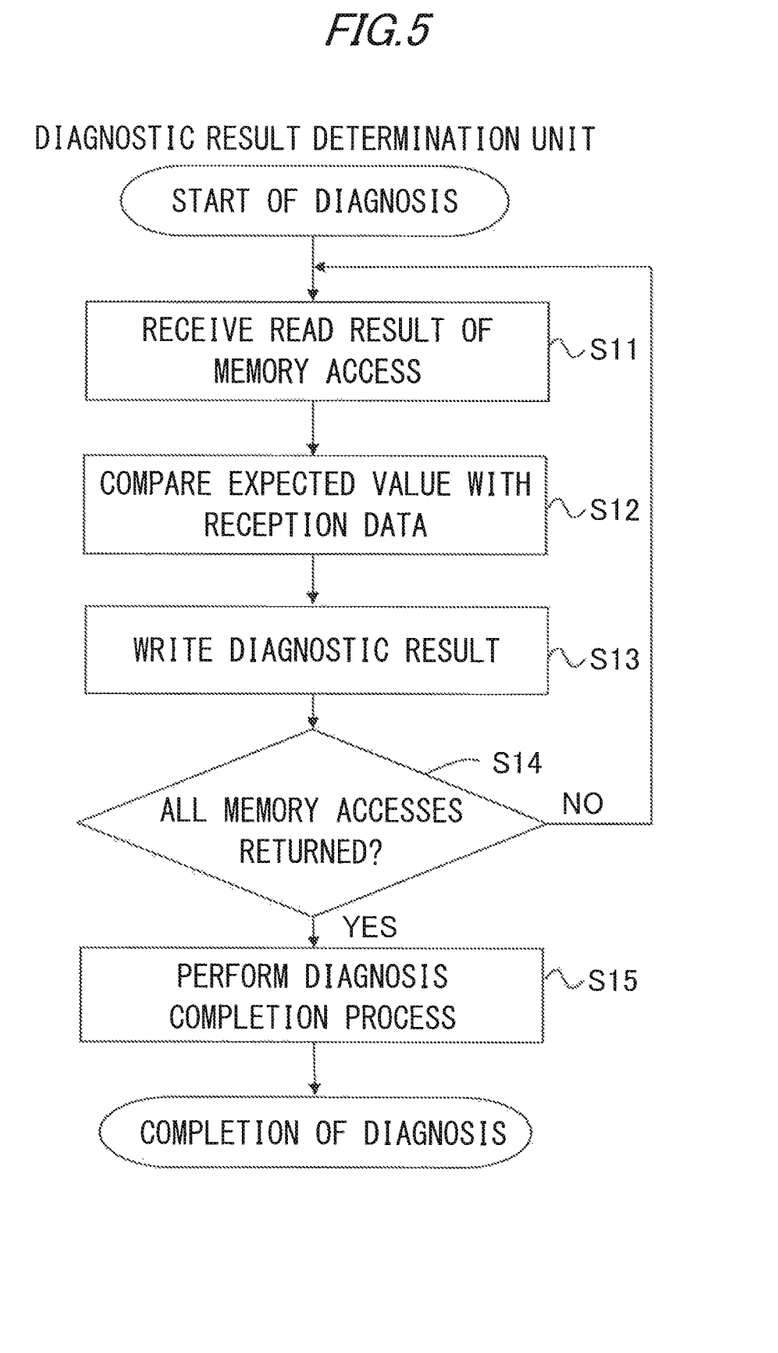
FIG. 5 is a flowchart illustrating a control sequence of the diagnostic result determination unit.

FIG. 5 illustrates a sequence of the determination unit 1221. The determination unit 1221 receives a result of the read access to the test target memory (e.g., the memory 2-1) through the diagnostic memory access unit 123 (S11). The determination unit 1221 compares the received read data with the expected value (S12). The determination unit 1221 writes the diagnostic result to the memory (e.g., the memory 2-2) for storing the diagnostic result through the diagnostic result output unit 1222, the memory diagnostic result write unit 1223 and, e.g., the memory controller 11-2. The determination unit 1221, when all of the memory accesses are returned (YES I S14), performs a diagnosis completion process, and completes the operation (S15). The return of the memory access is confirmed by an event that the diagnostic memory access unit 123 enters a state of standing by till the diagnosis is completed, and an event that there is obtained a read result corresponding to a memory access count transmitted by the diagnostic memory access unit 123. Note that the diagnostic system setting/control unit 121 notifies the determination unit 1221 that the diagnostic memory access unit 123 enters the state of standing by till the diagnosis is completed.

The external controller 3 causes migration of the information on the memory having recorded the diagnostic results to the external storage device, and analyzes the migrated information. The diagnostic data for memory cell are disabled from being deployed on the memory, displayed and analyzed as they are. Actually, it is sufficient to match with a resolution of a monitor, and hence such a method may be used that the diagnostic results of the memory cells existing a certain x-y range are merged and displayed as a histogram. Existing methods are sufficiently available for displaying the histogram. Take one method for instance, the histogram is obtained by making a frequency distribution in a way of segmenting, e.g., regions of addresses in an overall address area.

The processor 1 according to Embodiment 1 can diagnose the memory 2 without any error stop substantially in the same short period of time as the access time to the memory 2, and can acquire the diagnostic result on a per memory cell basis. Consequently, in the test target range of the memory 2, the external controller 3 can acquire the failure status or a variation of characteristics and other equivalent elements of the memory 2 after being installed in the information processing apparatus at the memory cell level. The external controller 3 is thereby enabled to check the failure from a delivery of the memory onward and further the failure after being installed.

Moreover, the external controller 3 can statistically process the acquired failure status or the acquired variation of characteristics and other equivalent elements of the memory 2. An abnormal status depending on an installation configuration can be detected from information of the statistically processed results. The information of the statistically processed results becomes additional information useful for progressing an examination of the cause of failure, thereby enabling enhancement of a possibility of improving a yield.

The memory diagnostic controller 12 causes the selectors 124, 125 to select the access to the memory for the diagnosis and the access to the memory for storing the diagnostic result of the determination unit, and can thus access the plurality of memories 2, i.e., the memories 2-1, 2-2. In other words, one of the memory 2-1 and the memory 2-2 can be set as the diagnostic target memory, while the other memory can be set as the storage location memory for storing the diagnostic result. The memory diagnostic controller 12 according to Embodiment 1 selects the read results from the memories 2-1, 2-2 through the selector 126, and can determine the diagnostic results. To be specific, the memory diagnostic controller 12 according to Embodiment 1 sets the proper selection signals in the selectors 111-1, 111-2, 124, 125, 126, thus setting one of the memory 2-1 and the memory 2-2 as the diagnostic target memory and the other as the storage location memory for storing the diagnostic result. The memory diagnostic controller 12 is thereby enabled to execute the diagnosis and the storage of the diagnostic result in parallel.

Further, the memory diagnostic controller 12 according to Embodiment 1 can block the accesses from the core cache 10 and can generate the memory accesses for diagnosing the memories 2-1, 2-2 by the diagnostic memory access unit 123 to generate the access to the memory for the diagnosis and the selectors 111-1, 111-2.

When each of the memories 2-1, 2-2 has the same storage capacity, it is feasible to execute the diagnosis and store the diagnostic result in parallel without interrupting the memory access to the diagnostic target memory. Whereas when the memory for storing the diagnostic result has the storage capacity smaller than the capacity of the diagnostic target memory in the memories 2-1, 2-2, the interruption pointer 1235 receives setting of the value corresponding to the address for interrupting the diagnosis upon reaching the limit of the storage capacity of the memory for storing the diagnostic result, thereby interrupting the diagnostic process. After the external controller 3 for the diagnostic result has read the diagnostic result of the diagnosis executed before the interruption, a remaining part of diagnosis can be performed. In other words, even when the memories 2-1, 2-2 have the storage capacities that are not coincident with each other, the processes of the memory diagnostic controller 12 exemplified in Embodiment 1 can be applied to this case.

Embodiment 2

A second embodiment (Embodiment 2) will be described in FIGS. 6 and 7. The processor 1 in Embodiment 1 saves the diagnostic result in, e.g., the memory 2-2 neighboring to the diagnostic target memory 2-1 by providing the write path to the memories 2-1, 2-2 neighboring to each other according to Solution 1. More specifically, according to Embodiment 1, the memory controllers 11-1, 11-2 are provided to the memories 2-1, 2-2. The memory diagnostic controller 12 stores the diagnostic result of the memory 2-1 in the memory 2-2 in parallel with diagnosing, e.g., the memory 2-1. After finishing the diagnosis, the external controller 3 reads the diagnostic result stored in the memory 2-2, and performs the analysis and other equivalent operations.

The processor 1 in Embodiment 2 uses a secondary cache memory or data cache memory for retaining the value of the diagnostic result according to Solution 2. For example, the external controller 3 saves the diagnostic result in an external auxiliary storage. Other configurations and operations of Embodiment 1 are the same as those of Embodiment 2. Such being the case, the same components as those in Embodiment 1 are marked with the same numerals and symbols, and their explanations are omitted.

Figure 6:
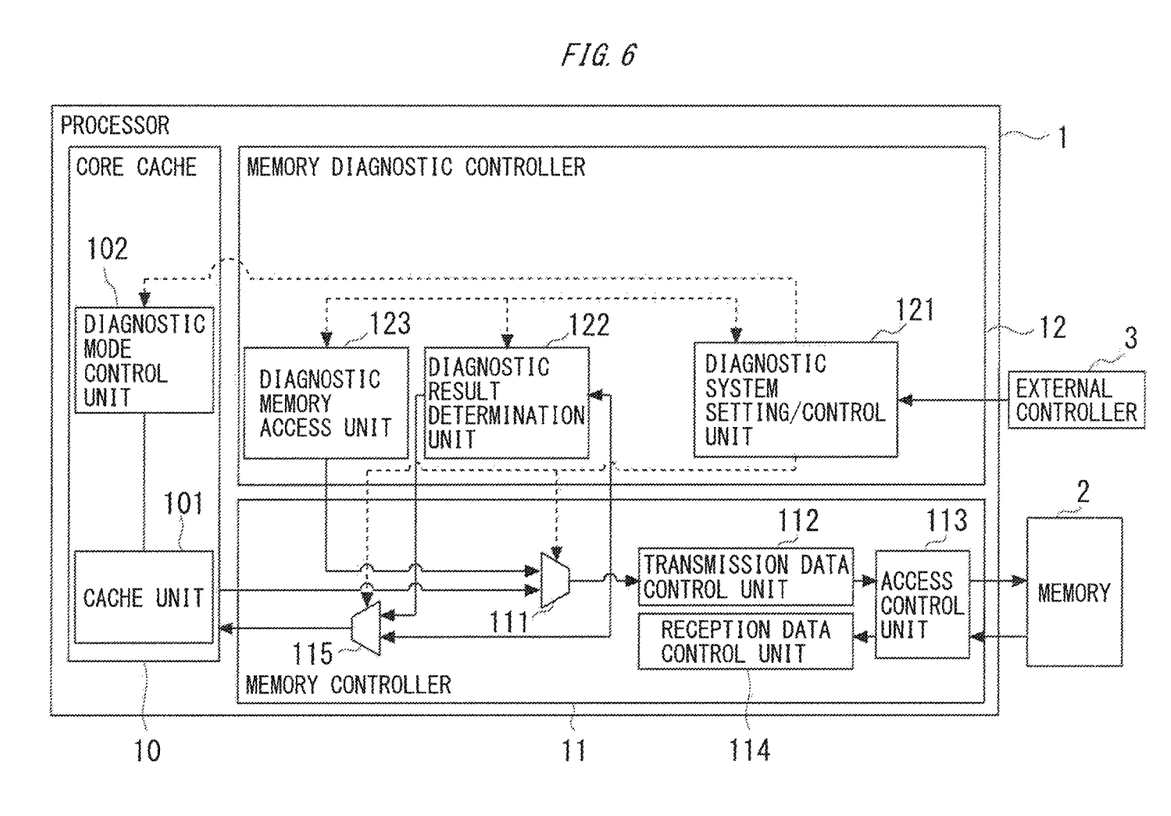
FIG. 6 is a diagram illustrating a configuration of the information processing apparatus according to Embodiment 2.

FIG. 6 illustrates a configuration of the information processing apparatus according to Embodiment 2. The information processing apparatus according to Embodiment 2 includes the processor 1, the memory 2 and the external controller 3. The processor 1 includes the core cache 10, the memory controller 11, and the memory diagnostic controller 12. A configuration of the memory controller 11 is the same as the configuration of each of the memory controllers 11-1, 11-2 in Embodiment 1. Specifically, the memory controller 11 includes the selector 111, the transmission data control unit 112, the access control unit 113, the reception data control unit 114, and a selector 115. The selector 111, the transmission data control unit 112, the access control unit 113 and the reception data control unit 114 respectively have the same configurations as those in Embodiment 1, and hence their explanations are omitted. Embodiment 2 adds the selector 115 to the memory controller 11 as compared with Embodiment 1.

The selector 115 selects, based on the selection signal of the diagnostic system setting/control unit 121, any one of the diagnostic result given from the diagnostic result determination unit 122 and the read data read by the reception data control unit 114 from the memory 2. To be specific, when diagnosing the memory 2, the diagnostic system setting/control unit 121 controls the selector 115 to select the diagnostic result given from the diagnostic result determination unit 122, while blocking the read data from the memory 2. As a consequence, in Embodiment 2, a cache unit 101 of the core cache 10 stores the diagnostic result of the memory 2 or the diagnostic result of the diagnostic target portion of the memory 2 in the same procedure as in Embodiment 1. The external controller 3 acquires the diagnostic result stored in the cache unit 101 via the diagnostic system setting/control unit 121, and may simply perform the same analysis as in Embodiment 1. The cache unit 101 is one example of "a cache".

The core cache 10 includes the cache unit 101 and a diagnostic mode control unit 102. The cache unit 101 has a cache memory and a cache controller. The diagnostic result selected by the selector 115 is stored in the cache memory via the cache controller of the cache unit 101. The diagnostic mode control unit 102 controls the cache controller of the cache unit 101 not to save contents of the cache memory in the memory 2.

The cache unit 101 is, e.g., a Set Associative cache memory. When the cache unit 101 operates based on a set-associative scheme, the diagnostic memory access unit 123 determines the diagnostic target range of the memory 2 in a range not causing a sweep of Way in one Set. For a simple consideration, it is assumed that the cache unit 101 has a capacity of, e.g., 4096 bytes. A cache block size is to be 8 bytes. A Set count is "256", and each Set is to be provided with 2 Ways (Way 0 and Way 1 each given one cache block size). In this case, it may be sufficient that the diagnostic target range of the memory 2 is limited to a 4096-byte range, and the diagnosis is executed in a range enabling the cache unit 101 to store the diagnostic result in the diagnostic target address.

Figure 7:
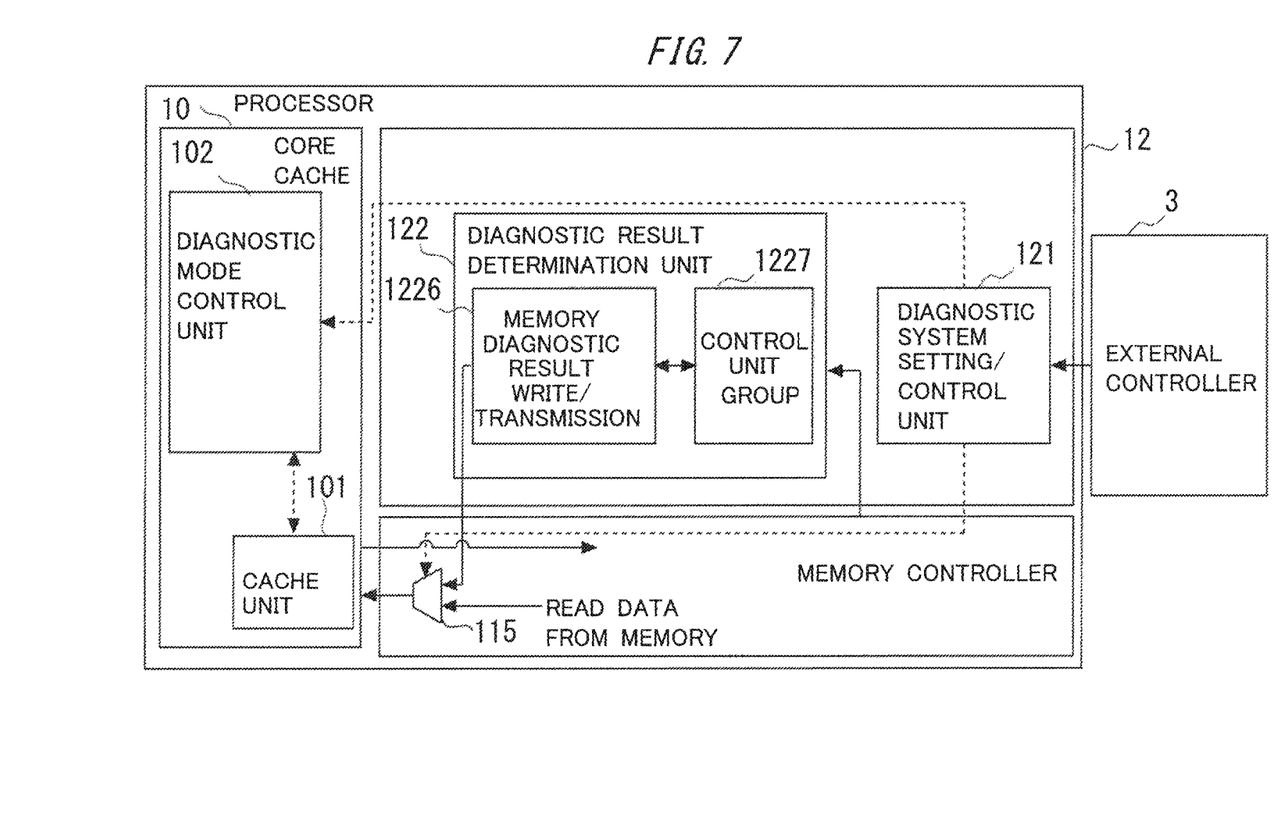
FIG. 7 is a diagram illustrating the diagnostic result determination in detail.

FIG. 7 illustrates details of the diagnostic result determination unit 122. In Embodiment 2, the diagnostic result determination unit 122 has a memory diagnostic result write/transmission unit 1226 in place of the memory diagnostic result write unit 1223 in Embodiment 1. Note that Embodiment 2 has the same configurations exclusive of the memory diagnostic result write/transmission unit 1226 of the diagnostic result determination unit 122 as in Embodiment 1. This being the case, FIG. 7 depicts a control unit group 1227 as a substitute for the determination unit 1221, the diagnostic result output unit 1222, the diagnostic test pattern expected value unit 1224 and the diagnostic status 1229 illustrated in Embodiment 1, of which the configurations are omitted.

Upon starting the diagnosis, the diagnostic mode control unit 102 sets the cache block in a status of retaining the data when the data is returned to the cache block from the memory controller, thereby enabling the cache unit 101 to store the diagnostic results equivalent to the storage capacity of the cache unit 101.

The following is a process of the memory diagnostic result write/transmission unit 1226. It is now assumed that the cache unit 101 is a cache memory based on the set-associative scheme having a Set count "S" and a Way count "W". A block size of the cache unit 101 is to be "B" (Words). Herein, the Word is equivalent to a size of storage data in each individual address of the memory 2. The data is therefore transferred and received on a block size (Words B) basis between the memory 2 and the cache unit 101, and the address is identified on a Words-B basis by a tag of the cache unit 101. More specifically, the addresses of the memory 2 are delimited by fields, i.e., a low-order bit field (bits of a range of numerical values of 0 through B−1) for designating Offset within the cache block, an index field (bits of a range of numerical values of 0 through S−1) for designating Set, and a high-order bit field (numerical values of 0 through W−1) for designating Tag.

Addresses of Memory 2=High-Order Bits (0 through W−1)+Index field (0 through S−1)+Low-Order Bits (0 through B−1);

In this case, the cache unit 101 has a capacity given by (S×W×B) Words, and the diagnosis of the memory 2 is executed on a (S×W×B) Word basis, and the diagnostic result is stored in the cache unit 101.

(1) The memory diagnostic result write/transmission unit 1226 generates Index from the bits of the diagnostic target address, and accesses Set of the cache unit 101. Herein, an example of Embodiment 2 is that the bits for determining the index are the bits of the value range of 0 through S−1 with respect to the Set count "S".

(2). Tag is generated by the high-order bits excluding Offset (numerical values of 0 through B−1) and Index (numerical values of 0 through S−1) in the diagnostic target addresses. For instance, all Tags are occupied by the high-order bit values of 0 through W−1, and a result, equivalent to the cache block (Word B), of the diagnostic target address is stored in first Word of the block associated with each Tag.

(3). The memory diagnostic result write/transmission unit 1226 generates a cache block by batchwise aggregating a B-number of addresses, having same Tags of 0, 1, 2, . . . (W−1), of Offsets of 0 through B−1, and writes the generated cache block to the cache unit 101. In other words, the memory diagnostic result write/transmission unit 1226 converts the data of the diagnostic result into data of the cache block size of the cache memory.

It may be sufficient that the external controller 3 acquires the diagnostic result stored in the cache via the diagnostic system setting/control unit 121 and performs the analysis in the same way as in Embodiment 1. Specifically, the external controller 3 accesses the processor via the diagnostic system setting/control unit 121 and conducts the control to write the information of the cache unit 101 to the external storage area, and, after reading the diagnostic result, the diagnostic system setting/control unit 121 starts up the next diagnostic process. More specifically, the external controller 3 indicates the address to the processor so that the processor accesses the same Set and Way as those in the area of the cache unit 101 storing the diagnostic result. The processor acquires the test result from the cache unit 101 by accessing the relevant address, and writes the test result to the external storage area.

As discussed above, the information processing apparatus according to Embodiment 2, similarly to Embodiment 1, divides the memory 2 into the segments equivalent to the capacity of the cache unit 101 at the maximum, and executes diagnosing every divided segment of the memory 2. The diagnostic result is stored in the cache unit 101. After finishing the diagnosis, the external controller 3 may simply read the diagnostic result from the cache unit 101 of the core cache 10 via the diagnostic system setting/control unit 121. Thereafter, the information processing apparatus executes diagnosing the next segment divided on the memory 2, and may simply store the diagnostic result in the cache unit 101. According to Embodiment 2, it is therefore possible to diagnose the memory 2 and store the diagnostic result in the cache unit 101 in parallel on a per cache block basis.

From now on, such a possibility exists that the variation of the electric characteristics, the failures and other equivalent changes will be exerted on a wider range of memory than hitherto due to physical loads of various shapes and structures on the memory. Such a possibility is also considered to increase that the failure occurs with the failure cause depending on the physical position. It is therefore predicted that the diagnosis of the memory and the analysis of the failure are desired even after installing the memory into the computer in addition to when manufacturing the memory. The processor 1 described in Embodiments 1 and 2 analyses the variation of the electric characteristics, the failures and other equivalent changes, which may occur due to the physical loads of the multiple shapes and structures on the memory, and hence the diagnostic result may be provided in greater detail than hitherto and at an equal or higher speed to or than hitherto.

A failure may be analyzed from some limited number of failure addresses simply when examining a mere tendency of the memory failure. However, a possibility will exist from now on, in which the failure of the memory installed in an information processing apparatus, a variation of electric characteristics and other equivalent changes occur in a wider range than hitherto, and a data size for analyzing the failure increases. It is also desirable to analyze the failure of the memory after being installed in a short period of time.

The processor 1, an information processing apparatus including the processor 1, and the control method of the processor 1 according to embodiments 1 and 2 enable the diagnosis of the memory in the wider range and faster than hitherto after installing the memory in the apparatus.

All example and conditional language recited herein are intended for pedagogical purposes to aid the reader in understanding the invention and the concepts contributed by the inventor to furthering the art, and are to be construed as being without limitation to such specifically recited examples and conditions, nor does the organization of such example in the specification relate to a showing of the superiority and inferiority of the invention. Although the embodiment(s) of the present invention(s) has(have) been described in detail, it should be understood that the various changes, substitutions, and alterations could be made hereto without departing from the spirit and scope of the invention.

What is claimed is:

1. An arithmetic processing device comprising:
   a first memory control unit configured to control an access to a first memory;
   a second memory control unit configured to control an access to a second memory; and
   a diagnostic control unit configured to sequentially diagnose first parts within the first memory via the first memory control unit and to sequentially store in the second memory, via the second memory control unit, diagnostic results of sequentially diagnosing the first parts, the storing being in parallel with the diagnosing the first parts via the first memory control unit when diagnosing the first parts within the first memory, and
   wherein the diagnostic control unit is further configured to sequentially diagnose second parts within the second memory via the second memory control unit and sequentially store in the first memory, via the first memory control unit, diagnostic results of sequentially diagnosing the second parts, the storing being in parallel with the diagnosing the second parts via the second memory control unit when diagnosing the second parts within the second memory.

2. The arithmetic processing device according to claim 1, wherein the diagnostic control unit includes:
   an access unit configured to transmit an access signal to any of the first memory and the second memory as a diagnostic target memory;
   a first selector configured to select a read result from the diagnostic target memory when the access signal is an access signal making a request for reading;
   a determination unit configured to diagnose the read result from the diagnostic target memory, the read result being obtained from the first selector;
   a second group of selectors, one of the second group of selectors being configured to select an access signal for diagnosing the first memory and the one of the second group of selectors being configured to establish connections to the first memory control unit, and another of the second group of selectors being configured to select an access signal sent to the second memory to store diagnostic result of the determination unit, and the another of the second group of selectors being configured to establish connections to the second memory control unit when the first memory is the diagnostic target memory,
   the another of the second group of selectors being configured to select an access signal for diagnosing the second memory and being configured to establish connections to the second memory control unit, and the one of the second group of selectors being configured to select an access signal sent to the first memory to store the diagnostic result of the determination unit and being configured to establish connections to the first memory control unit when the second memory is the diagnostic target memory; and
   a setting unit configured to supply selection signals of the first selector and the second group of selectors.

3. The arithmetic processing device according to claim 2, wherein the first memory control unit includes one of a third group of selectors configured to select the access signal sent to the first memory from an arithmetic core in the arithmetic processing device and the access signal to the first memory from the diagnostic control unit,
   the second memory control unit includes another of the third group of selectors configured to select the access signal sent to the second memory from the arithmetic core in the arithmetic processing device and the access signal sent to the second memory from the diagnostic control unit, and
   the setting unit outputs selection signals of the one of the third selectors and the another of the third selectors.

4. The arithmetic processing device according to claim 1, wherein the first memory and the second memory have a same capacity.

5. The arithmetic processing device according to claim 1, further comprising an interruption indicating unit configured to interrupt, when the second memory is a storing target memory, the second memory has a storage capacity smaller than a storage capacity of the first memory, and when the first memory is a diagnostic target memory, diagnosing of the first memory by the diagnostic control unit, in an event of a diagnostic result reaching a limit of the storage capacity of the second memory, and
   the interruption indicating unit configured to interrupt, when the first memory is the storing target memory, the first memory has a storage capacity smaller than a storage capacity of the second memory, and when the second memory is the diagnostic target memory, diagnosing of the second memory by the diagnostic control unit, in an event of a diagnostic result reaching a limit of the storage capacity of the first memory.

6. The arithmetic processing device according to claim 1, wherein the first memory is a main memory, and the second memory is a cache memory.

7. An information processing apparatus comprising:
   a first memory;
   a second memory; and
   an arithmetic processing device including:
      a first memory control unit configured to control an access to the first memory;
      a second memory control unit configured to control an access to the second memory; and
      a diagnostic control unit configured to sequentially diagnose first parts within the first memory via the first memory control unit and sequentially store in the second memory, via the second memory control unit, diagnostic results of sequentially diagnosing the first parts, the storing being in parallel with the diagnosing the first parts via the first memory control unit when diagnosing the first parts within the first memory, and wherein the diagnostic control unit is further configured to sequentially diagnose second parts within the second memory via the second memory control unit and sequentially store in the first memory, via the first memory control unit, diagnostic results of sequentially diagnosing the second parts, the storing being in parallel with the diagnosing the second parts via the second memory control unit when diagnosing the second parts within the second memory.

8. A control method of an arithmetic processing device comprising:

sequentially diagnosing first parts within a first memory via a first memory control unit and sequentially storing in a second memory, via a second memory control unit, diagnostic results of sequentially diagnosing the first parts, the storing being in parallel with the diagnosing the first parts via the first memory control unit when diagnosing the first parts within the first memory; and sequentially diagnosing second parts within the second memory via the second memory control unit and sequentially storing in the first memory, via the first memory control unit, diagnostic results of sequentially diagnosing the second parts, the storing being in parallel with the diagnosing the second parts via the second memory control unit when diagnosing the second parts within the second memory.

9. The control method of the arithmetic processing device according to claim 8, further comprising:

first selecting an access signal sent to one of the first memory and the second memory as a diagnostic target memory from a group comprising a first access signal sent to the first memory and a second access signal sent to the second memory, and transmitting the first selected access signal to the diagnostic target memory;

selecting, when the first selected access signal is an access signal making a request for reading, a read result from the diagnostic target memory;

diagnosing the selected read result from the diagnostic target memory; and second selecting an access signal sent to another of the first memory and the second memory as the storing target memory configured to store the diagnostic result from a group comprising a third access signal sent to the first memory and a fourth access signal sent to the second memory, and transmitting the second selected access signal to the storing target memory.

* * * * *